United States Patent [19]
Bhatti et al.

[11] Patent Number: 5,895,883
[45] Date of Patent: Apr. 20, 1999

[54] APPARATUS FOR DAMPENING MOVEMENT OF PASSIVATION MATERIAL IN AN ELECTRONIC MODULE

[75] Inventors: Pardeep Kumar Bhatti, Carmel; John Allen Hearn; Jack A. Bednarz, both of Kokomo; Daniel Alan Lawlyes, Cicero, all of Ind.

[73] Assignee: Delco Electronics Corp., Kokomo, Ind.

[21] Appl. No.: 08/908,019

[22] Filed: Aug. 11, 1997

[51] Int. Cl.$^6$ ....................................... H05K 5/00
[52] U.S. Cl. ....................................... 174/17 LF
[58] Field of Search ..................... 174/17 R, 17 LF, 174/50, 59

[56] References Cited

U.S. PATENT DOCUMENTS

| | | |
|---|---|---|
| 2,740,001 | 3/1956 | Vergilio et al. ............... 174/59 X |
| 3,512,121 | 5/1970 | Bergeron ............... 439/722 |
| 5,005,069 | 4/1991 | Wasmer et al. ............... 357/72 |
| 5,274,194 | 12/1993 | Belcher ............... 174/50 |
| 5,650,919 | 7/1997 | Loh et al. ............... 361/779 |

Primary Examiner—Dean A. Reichard
Attorney, Agent, or Firm—Jimmy L. Funke

[57] ABSTRACT

An apparatus for dampening movement of passivation material in an electronic module and a method for manufacturing an electronic module incorporating such an apparatus are disclosed. The apparatus includes a housing defining a cavity sized to contain an electrical circuit and a non-solid passivation material. The apparatus further includes means for limiting movement of the passivation material within the cavity in at least one direction. In a preferred embodiment, the limiting means comprises at least one dam.

19 Claims, 1 Drawing Sheet

APPARATUS FOR DAMPENING MOVEMENT OF PASSIVATION MATERIAL IN AN ELECTRONIC MODULE

BACKGROUND OF THE INVENTION

1. Field of the Invention

The present invention relates generally to electronic modules of the type employing non-solid passivation material and, more particularly, to an apparatus for dampening movement of passivation material in an electronic module due to vibrations and the like.

2. Description of Related Art

Electronic modules are used in a wide variety of commercial applications. Typically, such modules include a housing or package defining a cavity for receiving and holding an electrical circuit. The electrical circuit often comprises a circuit board including a number of components such as IC's, wires, wirebonds and the like.

To protect the components of the electrical circuit from moisture and other environmental influences that can have undesirable effects on the circuitry, prior art electronic modules have often been provided with a non-solid passivation material. Typically, the cavity defined by the housing is filled with the passivation material. The passivation material will, thus, surround the electrical circuit thereby preventing undesirable environmental elements from reaching and influencing the circuit. Such passivation materials usually take the form of a liquid or gel.

While these passivation materials have been highly effective in protecting the electrical circuits of prior art electronic modules from many undesirable environmental influences, electronic modules employing these passivation materials have suffered from certain drawbacks. For example, electronic modules are frequently employed in applications where they are subjected to substantial vibrations and jolting. One such application is automobile uses. Electronic modules such as those employed as ignition circuits in automobiles and other motorized vehicles typically experience considerable levels of shaking, bumping and other vibrations. In prior art electronic modules, these vibrations have resulted in movement of the passivation material contained within the housing. Such movement can induce vibrations and other mechanical stresses in the parts of the module, including, but not limited to, the components of the electrical circuit, which can often lead to premature failure.

SUMMARY OF THE INVENTION

The present invention overcomes the drawbacks associated with the prior art by providing an electronic module comprising a housing for receiving and supporting an electrical circuit. The electronic module further includes a non-solid passivation material disposed within the housing for protecting the electrical circuit from environmental influences. Finally, the electronic module is provided with at least one dam disposed within the housing to limit or otherwise slow movement of the passivation material in at least one direction.

In accordance with another important aspect of the invention, an apparatus comprising a housing defining a cavity sized to contain an electrical circuit and a nonsolid passivation material; and, means for limiting movement of the passivation material within the cavity in at least one direction is provided. The limiting means is disposed within the cavity. In one preferred embodiment, the limiting means comprises at least one dam dividing the cavity into sections.

In another preferred embodiment, the limiting means is disposed near the at least one component of the electrical circuit to dampen the movement of the passivation material in the vicinity of the at least one component.

In accordance with yet another important aspect of the invention, a method for fabricating an electronic module is provided. The method comprises the steps of: providing a housing defining a cavity for receiving an electrical circuit; locating at least one dam in the housing dividing the cavity into at least two sections; positioning an electrical circuit having at least one component in the housing; and, at least partially filling the sections of the cavity with a non-solid passivation material, wherein movement of the passivation material induced by vibrations to the housing is dampened in at least one direction by the at least one dam.

DESCRIPTION OF THE PREFERRED EMBODIMENTS

Figure 1:
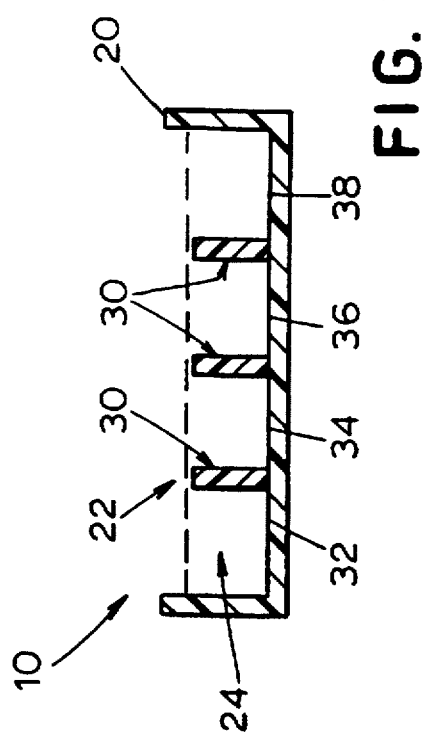
FIG. 1 is a schematic illustration of an electronic module constructed in accordance with the teachings of the instant invention.

An electronic module 10 constructed in accordance with the teachings of the instant invention is illustrated in FIG. 1. As explained in detail below, the inventive electronic module 10 dampens the movement of passivation material when the module 10 is subjected to vibrations or jostling, thereby prolonging the expected life of the product and enabling the module 10 to reliably function in harsher vibration environments than prior art device could withstand.

In order to receive and support the electrical circuitry of the electronic module 10, the module 10 is provided with a housing 20. As shown in FIG. 1, the housing 20 defines a cavity 22 which is sized to contain an electrical circuit (for ease of illustration, not shown) and passivation fluid 24. Although not shown in FIG. 1, the housing 20, preferably includes a top, four sides and a bottom, all of which are secured to one another to form an enclosure.

To protect the electrical circuitry from moisture and other environmental elements that can have adverse effects, the cavity 22 of the housing 20 is at least partially filled with a non-solid passivation material. The passivation material can be any known fluid or gel used as a passivation material in prior art electronic modules such as di-methyl silicon or fluoro-silicon gels. The components of the electrical circuit are preferably submerged in the passivation material to thereby effectively isolate the circuit from the corrosive effects of the environment and other undesirable influences.

In accordance with an important aspect of the invention, means for limiting movement of the passivation material 24 within the cavity 22 in at least one direction is provided. In the preferred embodiment, the limiting means comprises one or more dams 30 disposed in the cavity 22. As shown in FIG. 1, each of the dams 30 is preferably positioned to reduce movement of the passivation material 24. The dams 30 divide the cavity 22 into smaller sections 32, 34, 36, 38 thereby separating the passivation material 24 into smaller volumes and limiting the movement of that material 24 when the module 10 is subjected to vibrations and the like. Preferably, the dams 30 are located to avoid resonance conditions wherein reinforcing waves would be created in the passivation material 24 in response to vibrations.

Those skilled in the art will appreciate that the dams or obstructions 30 can take any shape or form sufficient to dampen or otherwise limit the movement of the passivation material induced by vibrations to the housing and the like. Those skilled in the art will further appreciate that dividing the passivation material into smaller volumes correspondingly reduces the amount of movement the passivation material will exhibit in response to vibrations and the like.

Although shown as separate structures in FIG. 1, in the preferred embodiment the dams 30 are preferably integrally formed with the housing 20. Thus, the dams 30 are preferably constructed of the same material as the housing 20. Alternatively, the dams 30 can be integrally formed with other components of the module such as the circuit board or substrate, or with the cover or the backplane of the housing. Although many different materials can be employed in this role without departing from the scope or the spirit of the invention, the housing 20 and dams 30 are preferably constructed of an inert substance that will not react with the passivation material 24. In the preferred embodiment, the housing 20 and dams 30 are constructed from molded plastic.

In accordance with an aspect of the invention, the dams 30 are preferably located to dampen movement of the passivation material in the vicinity of one or more components of the electronic module which would otherwise be susceptible to mechanical failure. To maximize the dampening effect of the dams 30 and the protection enjoyed by the components, one or more dams are positioned near the susceptible components. The adjacent dam(s) 30 serve to break the momentum of the passivation material 24 approaching the susceptible component thereby reducing the mechanical stress that component experiences. In one preferred embodiment, the dam(s) 30 are positioned to protect at least one component of the electrical circuit from excessive movement of the passivation material.

Figure 2:
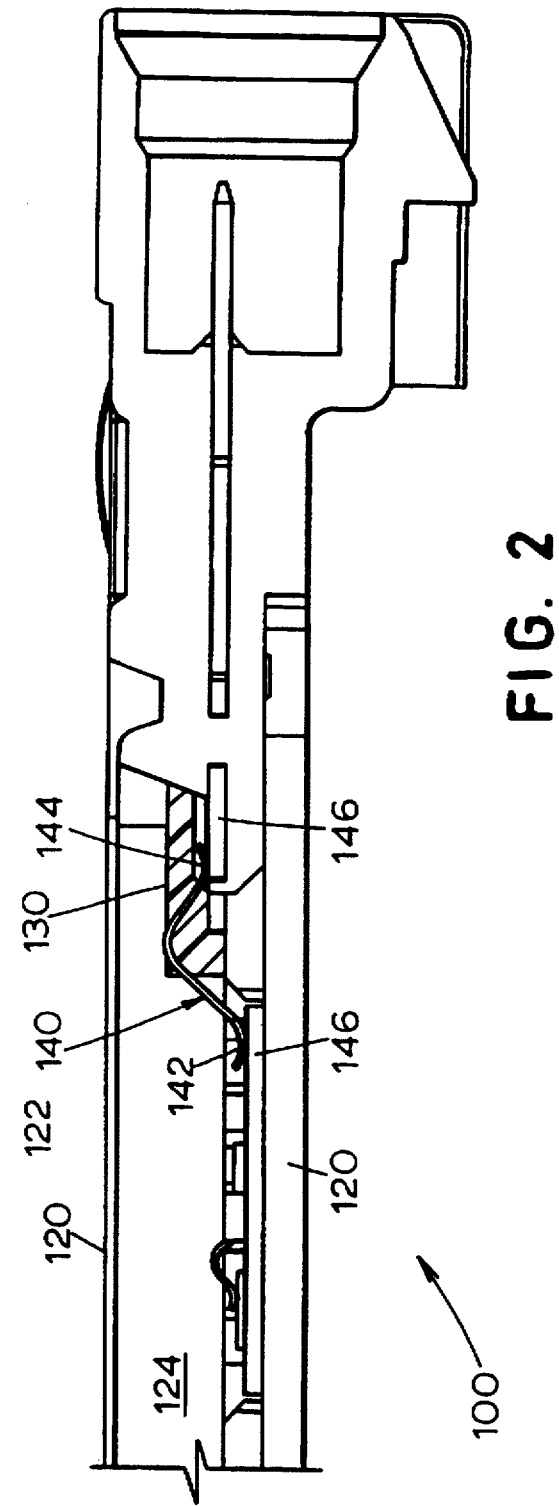
FIG. 2 is a cross-sectional view of an exemplary electronic module constructed in accordance with the teachings of the instant invention.

An exemplary embodiment of an electronic module 100 constructed in accordance with the teachings of the instant invention to protect a component of the electrical circuit is shown in FIG. 2. As with the more general embodiment discussed above in connection with FIG. 1, the electronic module 100 includes a housing 120 defining a cavity 122 filled with passivation material 124. However, in the embodiment illustrated in FIG. 2, the electrical circuit includes an aluminum wire 140 bonded between two contacts 142, 144 of circuit board 146. The aluminum wire 140 or the wire bond would be susceptible to premature mechanical failure in a prior art module incorporating the same, as it would be subjected to substantial movement of passivation material.

In accordance with an important aspect of the invention, a dam 130 is positioned adjacent the wire 140 to block the flow of passivation material 124 thereby reducing the stress experienced by the wire 140 due to vibration induced movements of the passivation material. This reduction in stress will result in a longer product life for the wire 140, and, thus, for the electronic module 100.

In accordance with an important aspect of the invention, a method for fabricating an electronic module of the foregoing type is provided. One preferred embodiment of such a method will now be described.

As an initial matter, the fabricator first provides a housing defining a cavity sized to receive an electrical circuit. Preferably, the housing has characteristics such as the housing 20 described above in connection with FIG. 1. Next, at least one dam is located within the housing to divide the cavity into at least two sections. The dam can be integral to the housing. Preferably, the dam is of the type described in connection with FIG. 1. Subsequently, an electrical circuit having at least one component is positioned within the cavity defined by the housing. The cavity is then at least partially filled with a passivation material of the type described above and the housing is sealed. As described above, the at least one dam dampens movement of the passivation material in at least one direction. Preferably, the at least one dam is located to dampen movement of the passivation material in the vicinity of the at least one component of the electrical circuit thereby reducing the mechanical stress experienced by that component.

Those skilled in the art will readily appreciate that although, for ease of explanation, the steps of the foregoing method were described as occurring in a particular time sequence, the method is not limited to any temporal arrangement. On the contrary, the steps of the inventive method can be performed in any order without departing from the scope or the spirit of the invention.

Furthermore, those skilled in the art will further appreciate that, although the invention has been described in connection with certain embodiments, there is no intent to limit the invention thereto. On the contrary, the intention of this application is to cover all modifications and embodiments fairly falling within the scope of the appended claims either literally or under the doctrine of equivalents.

What is claimed is:

1. An electronic module comprising:

a housing for receiving and supporting an electrical circuit;

a non-solid passivation material disposed within the housing for protecting the electrical circuit from environmental influences, said passivation material being subject to movement within the housing when the module is vibrated; and, at least one dam disposed within the housing and extending into a portion of said passivation material to limit movement of the passivation material within the housing.

2. An electronic module as defined in claim 1 wherein the at least one dam is integrally formed with the housing.

3. An electronic module as defined in claim 1 wherein the electrical circuit includes at least one wire and the at least one dam is disposed adjacent the at least one wire to reduce stress to the wire associated with the movement of the passivation material.

4. An electronic module as defined in claim 1 wherein the at least one dam divides the housing into at least two sections.

5. An electronic module as defined in claim 1 wherein the passivation material comprises a fluid.

6. An electronic module as defined in claim 1 wherein the passivation material comprises a gel.

7. An apparatus for holding an electrical circuit protected from the environment by a non-solid passivation material, the apparatus comprising:

a housing defining a cavity containing an electrical circuit and a non-solid passivation material that is subject to movement within the cavity when the module is vibrated; and, limiting means disposed within the cavity and extending into a portion of the passivation material for limiting movement of the passivation material within the cavity.

8. An apparatus as defined in claim 7 wherein the limiting means comprises at least one dam dividing the cavity into sections.

9. An apparatus as defined in claim 7 wherein the limiting means is disposed near at least one component to dampen the movement of the passivation material in the vicinity of the at least one component.

10. An apparatus as defined in claim 9 wherein the at least one component comprises a wire.

11. An apparatus as defined in claim 7 wherein the limiting means is integral to the housing.

12. An apparatus as defined in claim 7 wherein the limiting means comprises a plurality of dams dividing the cavity into a plurality of sections.

13. An apparatus as defined in claim 7 wherein the passivation material comprises a fluid.

14. An apparatus as defined in claim 7 wherein the passivation material comprises a gel.

15. A method of fabricating an electronic module comprising the steps of:

provding a housing defining a cavity for receiving an electrical circuit;

locating at least one dam in the housing dividing the cavity into at least two sections;

positioning an electrical circuit having at least one component in the housing; and, filing the sections of the cavity with a non-solid passivation material, wherein movement of the passivation material induced by vibrations to the housing is dampened in at least one direction by the at least one dam.

16. A method as defined in claim 15 wherein the at least one dam is integral to the housing.

17. A method as defined in claim 15 wherein at least one of the at least one dam is positioned near the at least one component of the electrical circuit to reduce movement of the passivation material in the vicinity of the at least one component.

18. A method as defined in claim 15 wherein the passivation material comprises a fluid.

19. A method as defined in claim 15 wherein the passivation material comprises a gel.

* * * * *